(12) United States Patent
Fukazawa

(10) Patent No.: US 7,138,710 B2
(45) Date of Patent: Nov. 21, 2006

(54) SEMICONDUCTOR DEVICE AND METHOD OF MANUFACTURING THE SAME, CIRCUIT BOARD, AND ELECTRONIC INSTRUMENT

(75) Inventor: Motohiko Fukazawa, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/862,373

(22) Filed: Jun. 8, 2004

(65) Prior Publication Data
US 2005/0017338 A1    Jan. 27, 2005

(30) Foreign Application Priority Data
Jun. 19, 2003  (JP)  ............... 2003-175322

(51) Int. Cl.
*H01L 23/02*  (2006.01)
(52) U.S. Cl. ............... 257/686; 257/E25.023
(58) Field of Classification Search ............... 257/686, 257/700
See application file for complete search history.

(56) References Cited

U.S. PATENT DOCUMENTS

| | | | |
|---|---|---|---|
| 5,408,123 A * | 4/1995 | Murai | 257/531 |
| 6,620,731 B1 * | 9/2003 | Farnworth et al. | 438/667 |
| 6,809,421 B1 * | 10/2004 | Hayasaka et al. | 257/777 |
| 2001/0013653 A1 * | 8/2001 | Shoji | 257/738 |
| 2002/0017710 A1 * | 2/2002 | Kurashima et al. | 257/686 |
| 2002/0145191 A1 * | 10/2002 | Murayama et al. | 257/686 |
| 2002/0185306 A1 * | 12/2002 | Mitani et al. | 174/260 |
| 2003/0080408 A1 | 5/2003 | Farnworth et al. | |
| 2003/0111721 A1 * | 6/2003 | Nakanishi et al. | 257/686 |

FOREIGN PATENT DOCUMENTS

JP    A 2001-127242    5/2001

* cited by examiner

*Primary Examiner*—Evan Pert
*Assistant Examiner*—Benjamin P. Sandvik
(74) *Attorney, Agent, or Firm*—Oliff & Berridge, PLC

(57) ABSTRACT

A semiconductor device includes a semiconductor substrate in which an integrated circuit is formed, a through-hole electrode which is formed through first and second surfaces of the semiconductor substrate and includes a first projecting section which projects from the first surface and a second projecting section which projects from the second surface, and an insulating layer which is formed in a region around the second projecting section except a part of the second surface so as to extend outward beyond an outer edge of the first projecting section.

20 Claims, 8 Drawing Sheets

$W_A \geqq W_B$

SEMICONDUCTOR DEVICE AND METHOD OF MANUFACTURING THE SAME, CIRCUIT BOARD, AND ELECTRONIC INSTRUMENT

Japanese Patent Application No. 2003-175322, filed on Jun. 19, 2003, is hereby incorporated by reference in its entirety.

BACKGROUND OF THE INVENTION

The present invention relates to a semiconductor device and a method of manufacturing the same, a circuit board, and an electronic instrument.

A semiconductor device in three-dimensional mounting form has been developed. It is known in the art that through-hole electrodes are formed in semiconductor chips, and the upper and lower through-hole electrodes are bonded by stacking the semiconductor chips. In a conventional structure, a measure to prevent occurrence of short circuits between the upper and lower adjacent semiconductor chips is insufficient. In more detail, solder used for electrical bonding melts and flows toward the periphery of the through-hole electrode, whereby short circuits with the semiconductor section occur in the terminal peripheral section.

BRIEF SUMMARY OF THE INVENTION

A semiconductor device according to one aspect of the present invention includes:

a semiconductor substrate which includes a first surface in which an integrated circuit is formed, and a second surface opposite to the first surface;

a through-hole electrode which is formed through the semiconductor substrate, and includes a first projecting section which projects from the first surface and a second projecting section which projects from the second surface; and an insulating layer which is formed in a region around the second projecting section except a part of the second surface so as to extend outward beyond an outer edge of the first projecting section.

A semiconductor device according to another aspect of the present invention includes:

a plurality of the semiconductor devices as defined in claim 1 which are stacked, wherein two adjacent semiconductor devices among the plurality of semiconductor devices are electrically connected through the through-hole electrodes.

A circuit board according to a further aspect of the present invention includes the above semiconductor device mounted thereon.

An electronic instrument according to a still further aspect of the present invention includes the above semiconductor device.

A method of manufacturing a semiconductor device according to a yet further aspect of the present invention includes:

(a) forming a through-hole electrode through a semiconductor substrate which includes a first surface in which an integrated circuit is formed and a second surface opposite to the first surface, the through-hole electrode including a first projecting section which projects from the first surface and a second projecting section which projects from the second surface; and (b) forming an insulating layer in a region around the second projecting section except a part of the second surface so as to extend outward beyond an outer edge of the first projecting section.

DETAILED DESCRIPTION OF THE EMBODIMENT

Figure 1A:
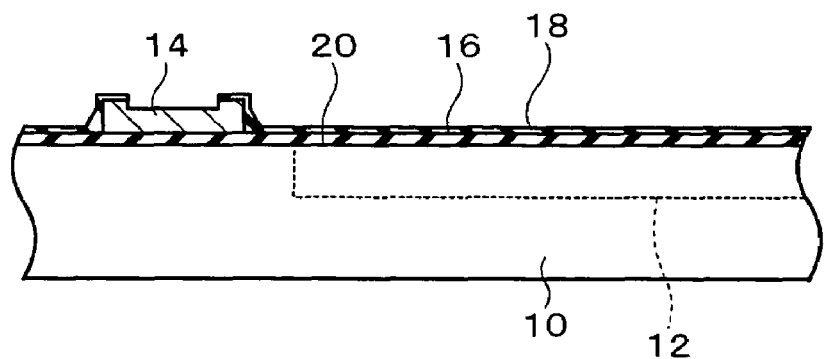
FIGS. 1A to 1D are illustrative of a method of manufacturing a semiconductor device according to an embodiment of the present invention.

According to embodiments of the present invention, occurrence of short circuits between stacked semiconductor substrates can be prevented, and flowing property of an underfill can be increased.

(1) A semiconductor device according to one embodiment of the present invention includes:

a semiconductor substrate which includes a first surface in which an integrated circuit is formed, and a second surface opposite to the first surface;

a through-hole electrode which is formed through the semiconductor substrate, and includes a first projecting section which projects from the first surface and a second projecting section which projects from the second surface; and an insulating layer which is formed in a region around the second projecting section except a part of the second surface so as to extend outward beyond an outer edge of the first projecting section.

According to this embodiment of the present invention, since the insulating layer is formed in a region around the second projecting section of the through-hole electrode except a region other than the region around the second projecting section, occurrence of short circuits can be prevented by sufficiently securing the gap between the stacked semiconductor substrates. Moreover, flowing property of an underfill material can be improved by sufficiently securing the gap between the stacked semiconductor substrates. Furthermore, since the second projecting section can be reinforced, electrical connection reliability between the stacked semiconductor substrates is improved.

(2) With this semiconductor device, an outer edge of the second projecting section may be smaller than the outer edge of the first projecting section.

(3) With this semiconductor device, a soldering material may be provided on the first projecting section.

(4) With this semiconductor device, the insulating layer may be formed to have a uniform thickness.

(5) With this semiconductor device, the insulating layer may be formed to become thinner as a distance from the second projecting section increases.

This allows the underfill material to flow smoothly between the stacked semiconductor substrates, whereby flowing property can be further improved. Therefore, a highly reliable semiconductor device can be provided.

(6) With this semiconductor device, the insulating layer may be formed so that an outline of the insulating layer has a similar shape to an outline of the first projecting section.

This enables the region around the first projecting section to be insulated.

(7) With this semiconductor device, the insulating layer may be formed so that an upper surface of the thickest portion of the insulating layer is on the same level as an upper surface of the second projecting section.

(8) With this semiconductor device, the insulating layer may be formed so that the thickest portion of the insulating layer is lower than the second projecting section.

Since the second projecting section has a section which projects from the insulating layer, the through-hole electrodes of the stacked semiconductor chips can be bonded securely, whereby electrical connection reliability is improved.

(9) A semiconductor device according to another embodiment of the present invention includes:

a plurality of the above semiconductor devices which are stacked, wherein two adjacent semiconductor devices among the plurality of semiconductor devices are electrically connected through the through-hole electrodes.

(10) A circuit board according to a further embodiment of the present invention includes the above semiconductor device mounted thereon.

(11) An electronic instrument according to a still further embodiment of the present invention includes the above semiconductor device.

(12) A method of manufacturing a semiconductor device according to a yet further embodiment of the present invention includes:

(a) forming a through-hole electrode through a semiconductor substrate which includes a first surface in which an integrated circuit is formed and a second surface opposite to the first surface, the through-hole electrode including a first projecting section which projects from the first surface and a second projecting section which projects from the second surface; and (b) forming an insulating layer in a region around the second projecting section except a part of the second surface so as to extend outward beyond an outer edge of the first projecting section.

According to this embodiment of the present invention, since the insulating layer is formed in a region around the second projecting section of the through-hole electrode except a region other than the region around the second projecting section, occurrence of short circuits can be prevented by sufficiently securing the gap between the stacked semiconductor substrates. Moreover, flowing property of an underfill material can be improved by sufficiently securing the gap between the stacked semiconductor substrates. Furthermore, since the second projecting section can be reinforced, electrical connection reliability between the stacked semiconductor substrates is improved.

(13) With this method of manufacturing a semiconductor device, an outer edge of the second projecting section may be smaller than the outer edge of the first projecting section.

(14) With this method of manufacturing a semiconductor device, a plurality of the integrated circuits may be formed in the semiconductor substrate, and the through-hole electrode may be formed in each of the integrated circuits, and the method may further include cutting the semiconductor substrate.

(15) This method of manufacturing a semiconductor device may further include stacking a plurality of the semiconductor substrates for which the steps (a) and (b) have been completed, and electrically connecting two of the semiconductor substrates adjacent to each other through the through-hole electrodes.

(16) This method of manufacturing a semiconductor device may further includes injecting an insulating material between the two semiconductor substrates adjacent to each other.

(17) With this method of manufacturing a semiconductor device, the insulating material may be formed of the same material as a material of the insulating layer.

This prevents occurrence of interfacial separation caused by different types of materials.

(18) With this method of manufacturing a semiconductor device, the step (a) may further include providing a soldering material on the first projecting section.

(19) With this method of manufacturing a semiconductor device, in the step (b), the insulating layer may be formed to have a uniform thickness.

(20) With this method of manufacturing a semiconductor device, in the step (b), the insulating layer may be formed to become thinner as a distance from the second projecting section increases.

This allows the underfill material to flow smoothly between the stacked semiconductor substrates, whereby flowing property can be further improved.

(21) With this method of manufacturing a semiconductor device, in the step (b), the insulating layer may be formed so that an outline of the insulating layer has a similar shape to an outline of the first projecting section.

This enables the region around the first projecting section to be insulated.

(22) With this method of manufacturing a semiconductor device, in the step (b), the insulating layer may be formed so that an upper surface of the thickest portion of the insulating layer is on the same level as an upper surface of the second projecting section.

(23) With this method of manufacturing a semiconductor device, in the step (b), the insulating layer may be formed so that the thickest portion of the insulating layer is lower than the second projecting section.

Since the second projecting section has a section which projects from the insulating layer, the through-hole electrodes of the stacked semiconductor chips can be bonded securely, whereby electrical connection reliability is improved.

The embodiments of the present invention are described below with reference to the drawings.

FIGS. 1A to 4B are illustrative of a method of manufacturing a semiconductor device according to an embodiment to which the present invention is applied. In the present embodiment, a semiconductor substrate 10 is used. At least a part or the entirety of an integrated circuit 12 (circuit including a transistor or memory, for example) is formed in the semiconductor substrate 10. At least a part of each of the integrated circuits 12 may be formed in the semiconductor substrate 10, or at least a part of one integrated circuit 12 may be formed in the semiconductor substrate 10. A plurality of electrodes 14 (pads, for example) are formed on the semiconductor substrate 10. The electrode 14 is electrically connected with the integrated circuit 12. The electrode 14 may be formed of aluminum. The shape of the surface of the electrode 14 is not limited, and is generally quadrilateral.

One or more layers of passivation films 16 and 18 are formed on the semiconductor substrate 10. The passivation films 16 and 18 may be formed of $SiO_2$, SiN, or a polyimide resin, for example. In the example shown in FIG. 1A, the electrode 14 and an interconnect (not shown) which connects the integrated circuit 12 with the electrode 14 are formed on the passivation film 16. The passivation film 18 is formed to avoid at least a part of the surface of the electrode 14. The passivation film 18 may be formed to cover the surface of the electrode 14, and a part of the electrode 14 may be exposed by etching a part of the passivation film 18. The passivation film 18 may be etched by either dry etching or wet etching. The surface of the electrode 14 may be etched when etching the passivation film 18.

Figure 1B:
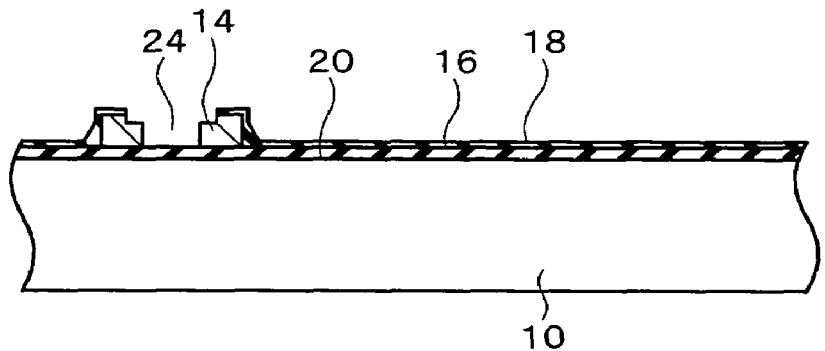

In the present embodiment, a recess section 22 (see FIG. 1C) is formed in the semiconductor substrate 10 from a first surface 20. The first surface 20 is the surface on the side on which the electrode 14 is formed (side in which the integrated circuit 12 is formed). The recess section 22 is formed to avoid a device and an interconnect of the integrated circuit 12. As shown in FIG. 1B, a through-hole 24 may be formed through the electrode 14. The through-hole 24 may be formed by etching (dry etching or wet etching). The electrode 14 may be etched after forming a resist (not shown) patterned by a lithographic step. In the case where the passivation film 16 is formed under the electrode 14, a through-hole 26 (see FIG. 1C) is formed through the passivation film 16. In the case where etching of the electrode 14 stops at the passivation film 16, the through-hole 26 may be formed by using an etchant differing from an etchant used to etch the electrode 14. In this case, a resist (not shown) patterned by a lithographic step may be formed.

Figure 1C:
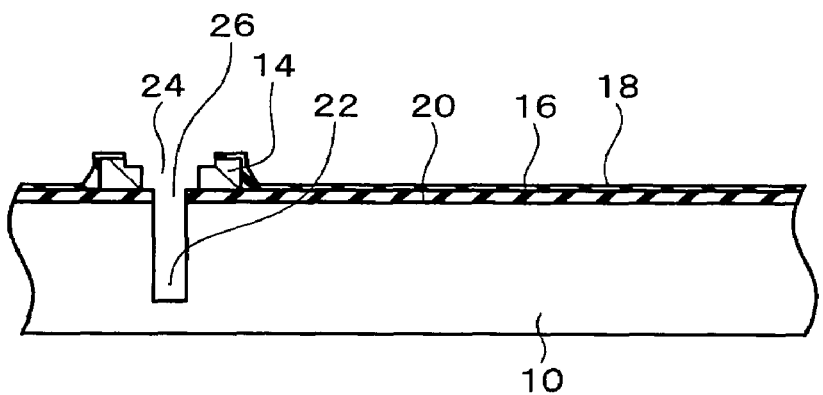

As shown in FIG. 1C, the recess section 22 is formed in the semiconductor substrate 10 so as to communicate with the through-hole 24 (and through-hole 26). The through-hole 24 (and through-hole 26) and the recess section 22 may be collectively called a recess section. The recess section 22 may be formed by etching (dry etching or wet etching). The recess section 22 may be etched after forming a resist (not shown) patterned by a lithographic step. A laser ($CO_2$ laser or YAG laser, for example) may be used to form the recess section 22. A laser may be used to form the through-holes 24 and 26. The recess section 22 and the through-holes 24 and 26 may be continuously formed by using one type of etchant or laser. A sand blasting process may be used to form the recess section 22.

Figure 1D:
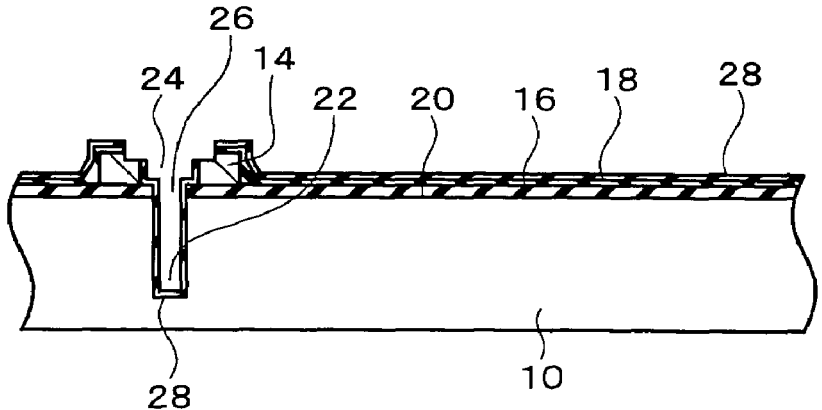

As shown in FIG. 1D, an insulating layer 28 may be formed inside the recess section 22. The insulating layer 28 may be an oxide film. In the case where the semiconductor substrate 10 is formed of Si, the insulating layer 28 may be formed of $SiO_2$ or SiN. The insulating layer 28 is formed on the bottom surface of the recess section 22. The insulating layer 28 is also formed on the inner wall surface of the recess section 22. The insulating layer 28 is formed so that the recess section 22 is not filled with the insulating layer 28. Specifically, a recess section is formed by the insulating layer 28. The insulating layer 28 may be formed on the inner wall surface of the through-hole 26 in the passivation film 16. The insulating layer 28 may be formed on the passivation film 18.

The insulating layer 28 may be formed on the inner wall surface of the through-hole 24 in the electrode 14. The insulating layer 28 is formed to avoid a part (upper surface, for example) of the electrode 14. The insulating layer 28 may be formed to cover the entire surface of the electrode 14, and a part of the electrode 14 may be exposed by etching (dry etching or wet etching) a part of the insulating layer 28. The insulating layer 28 may be etched after forming a resist (not shown) patterned by a lithographic step.

Figure 2A:
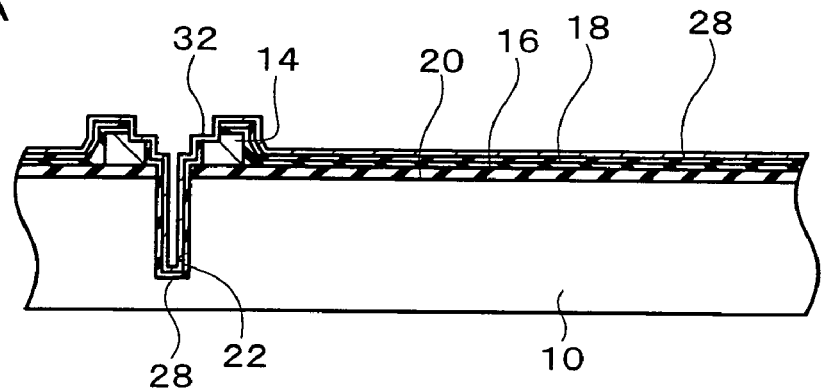
FIGS. 2A to 2D are illustrative of a method of manufacturing a semiconductor device according to an embodiment of the present invention.

A conductive section 30 (see FIG. 2B) is formed in the recess section 22 (inner side of the insulating layer 28, for example). The conductive section 30 may be formed of Cu, W, or the like. After forming an outer layer section 32 of the conductive section 30 as shown in FIG. 2A, a center section 34 of the conductive section 30 may be formed. The center section 34 may be formed of Cu, W, or doped polysilicon (low-temperature polysilicon, for example). The outer layer section 32 may include at least a barrier layer. The barrier layer prevents the material for the center section 34 or a seed layer described below from diffusing into the semiconductor substrate 10 (Si, for example). The barrier layer may be formed of a material (TiW or TiN, for example) differing from the material for the center section 34. In the case of forming the center section 34 by electroplating, the outer layer section 32 may include a seed layer. The seed layer is formed after forming the barrier layer. The seed layer is formed of the same material (Cu, for example) as the material for the center section 34. The conductive section 30 (at least the center section 34) may be formed by electroless plating or using an ink-jet method.

Figure 2B:
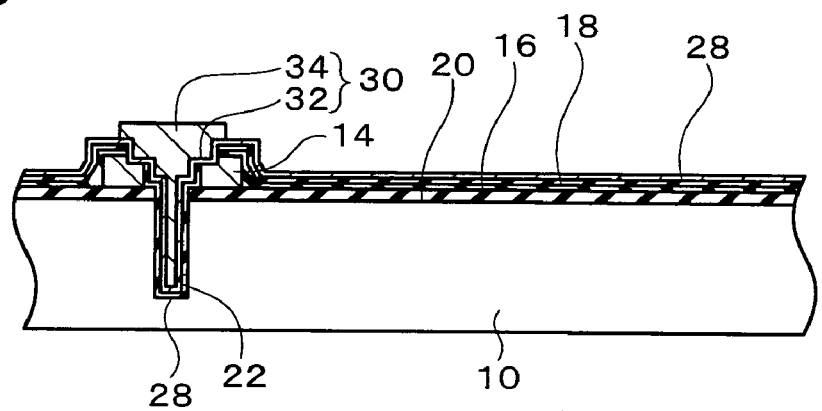
Figure 2C:
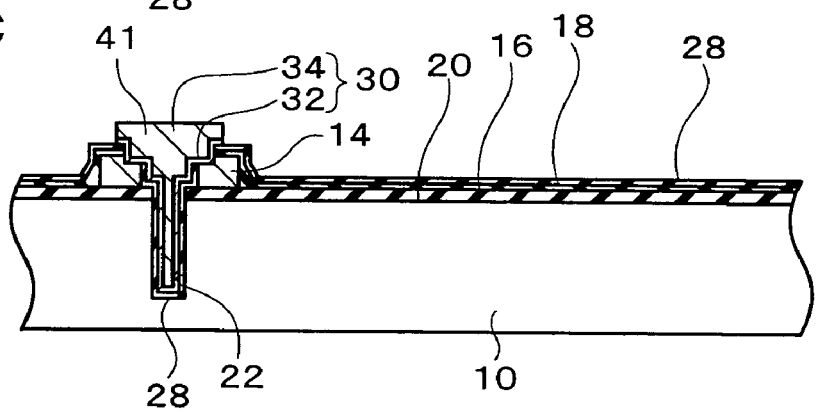

In the case where the outer layer section 32 is also formed on the passivation film 18 as shown in FIG. 2B, the outer layer section 32 is etched in the area formed on the passivation film 18 (and insulating layer 28), as shown in FIG. 2C. The conductive section 30 is formed by forming the center section 34 after forming the outer layer section 32. A part of the conductive section 30 is located inside the recess section 22 in the semiconductor substrate 10. Since the insulating layer 28 is present between the inner wall surface of the recess section 22 and the conductive section 30, the inner wall surface of the recess section 22 is electrically insulated from the conductive section 30. The conductive section 30 is electrically connected with the electrode 14. The conductive section 30 may be in contact with the exposed section of the electrode 14 from the insulating layer 28, for example. A part of the conductive section 30 may be located on the passivation film 18. The conductive section 30 may be formed only inside the region of the electrode 14. The conductive section 30 may project over at least the recess section 22. The conductive section 30 may project from the passivation film 18 (and insulating layer 28), for example.

As shown in FIG. 2C, a first projecting section 41 which projects from the first surface 20 of the semiconductor substrate 10 is formed in this manner. In the example shown in FIG. 2C, the first projecting section 41 also projects from the passivation film 18 (and insulating layer 28). The first projecting section 41 may be disposed over the electrode 14. The first projecting section 41 is a part of the conductive section 30.

As a modification, the center section 34 may be formed in a state in which the outer layer section 32 is allowed to remain on the passivation film 18. In this case, since a layer continuous with the center section 34 is also formed on the passivation film 18, this layer is etched.

Figure 2D:
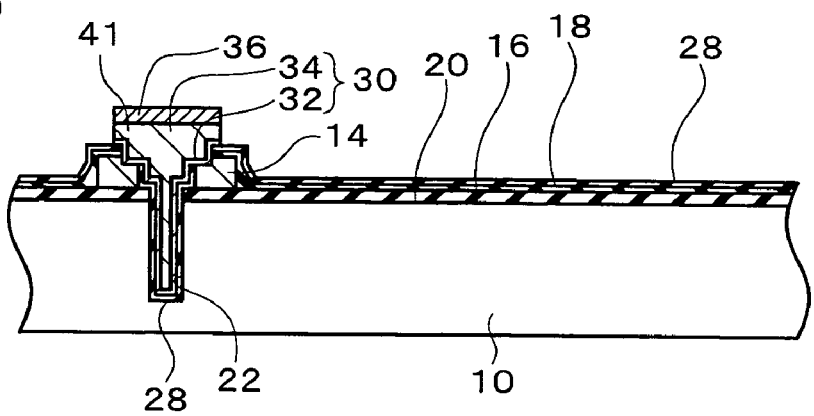

As shown in FIG. 2D, a soldering material 36 may be provided on the conductive section 30 (first projecting section 41 in more detail). The soldering material 36 may be formed of either soft solder or hard solder. The soldering material 36 may be formed while covering the region other than the conductive section 30 with a resist.

In the present embodiment, a second surface 38 (surface opposite to the first surface 20) of the semiconductor substrate 10 may be removed by using at least one of mechanical polishing/grinding and chemical polishing/grinding. This step is terminated before the insulating layer 28 formed in the recess section 22 is exposed. A step shown in FIG. 3B may be performed without performing the step shown in FIG. 3A.

Figure 3A:
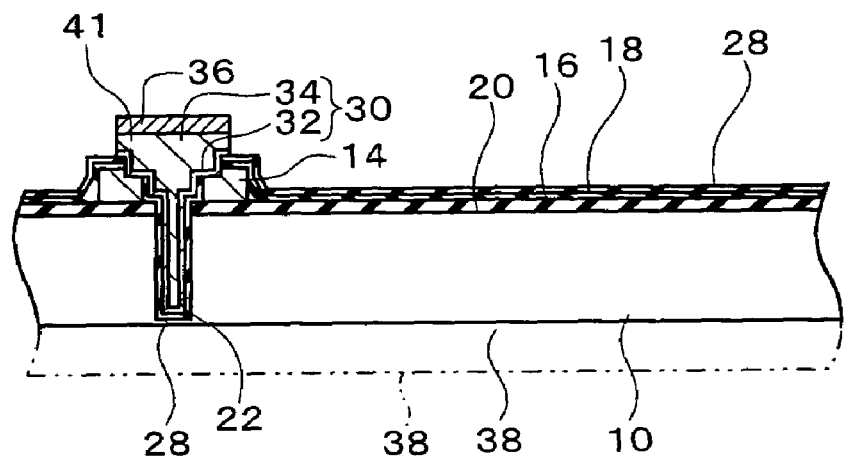
FIGS. 3A and 3B are illustrative of a method of manufacturing a semiconductor device according to an embodiment of the present invention.
Figure 3B:
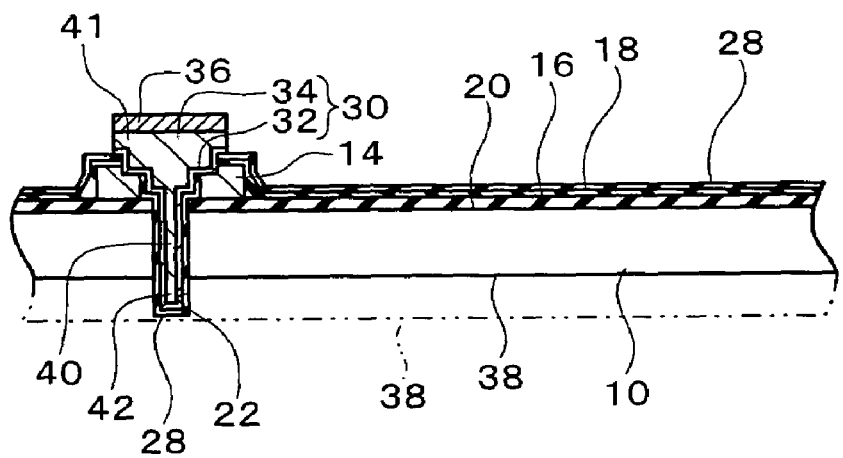

As shown in FIG. 3B, the conductive section 30 is allowed to project from the second surface 38. For example, the second surface 38 of the semiconductor substrate 10 is etched so that the insulating layer 28 is exposed. In more detail, the second surface 38 of the semiconductor substrate 10 is etched so that the conductive section 30 projects in a state in which the conductive section 30 (section inside the recess section 22 in more detail) is covered with the insulating layer 28. The second surface 38 may be etched using an etchant having properties which allow the amount of etching for the semiconductor substrate 10 (Si, for example) to be greater than the amount of etching for the insulating layer 28 ($SiO_2$, for example). The etchant may be $SF_6$, $CF_4$, or $Cl_2$ gas. Etching may be performed using a dry etching system. The etchant may be a mixed solution of hydrofluoric acid and nitric acid or a mixed solution of hydrofluoric acid, nitric acid, and acetic acid.

At least one of the steps shown in FIGS. 3A and 3B may be performed in a state in which a reinforcement member such as a glass plate, resin layer, or resin tape is provided (attached) to the first surface 20 of the semiconductor substrate 10 (using an adhesive or adhesive sheet), for example.

This allows the conductive section 30 to project from the second surface 38 of the semiconductor substrate 10. Specifically, a second projecting section 42 which projects from the second surface 38 is formed. A through-hole electrode 40 which includes the first projecting section 41 which projects from the first surface 20 and the second projecting section 42 which projects from the second surface 38 is formed in this manner. The end surface of the second projecting section 42 is exposed in a step described later. The through-hole electrode 40 is formed through the first and second surfaces 20 and 38. The horizontal cross-sectional shape (cross-sectional shape in the direction parallel to the first surface 20) of the through-hole electrode 40 may be circular, oval (elliptic), or polygonal such as quadrilateral. In the case where the horizontal cross-sectional shape of the through-hole electrode 40 is oval, the oval through-hole electrodes 40 may be longer in different directions. The horizontal cross-sectional shape of at least one of the first and second projecting sections 41 and 42 may be similar to the horizontal cross-sectional shape of the through-hole electrode 40 (circular in FIG. 4A).

Figure 4A:
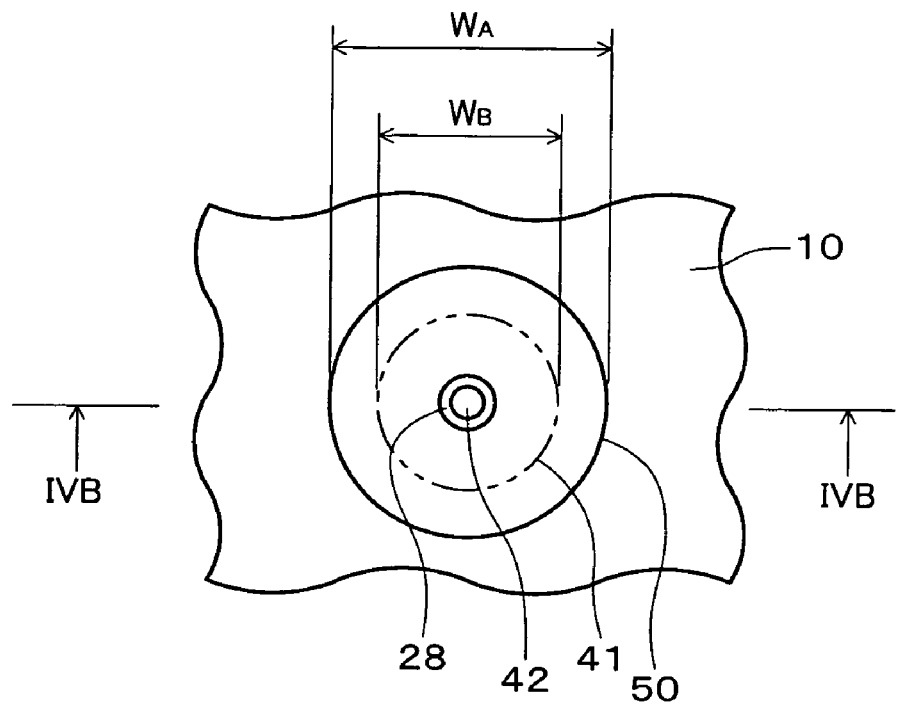
FIGS. 4A and 4B are partially enlarged views of a semiconductor device according to an embodiment of the present invention.
Figure 4B:
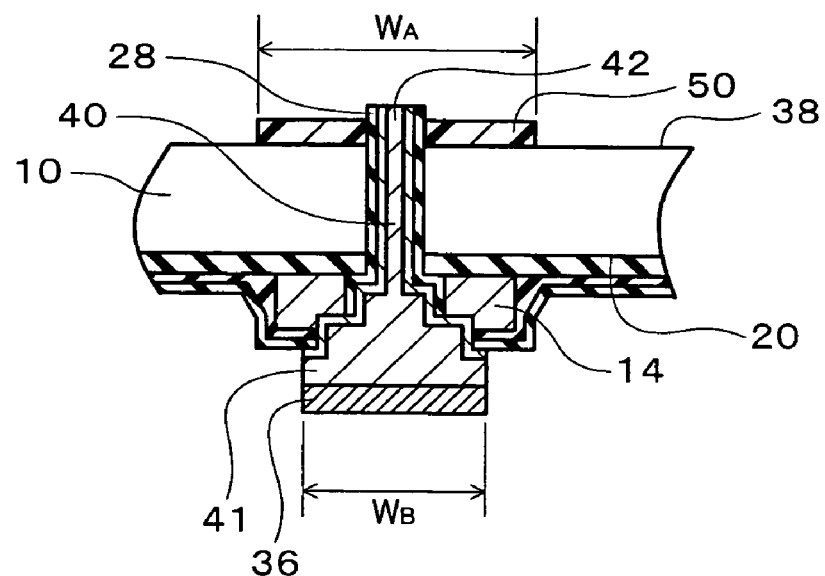

FIG. 4A is a partial plan view of the semiconductor device according to the present embodiment. FIG. 4B is a cross-sectional view along the line IVB–IVB shown in FIG. 4A. The through-hole electrode 40 is exposed from the first and second surfaces 20 and 38. In more detail, at least the end surface of the first projecting section 41 is exposed from the first surface 20, and at least the end surface of the second projecting section 42 is exposed from the second surface 38. The outer circumferential surface (side surface) may be exposed in addition to the end surface. A part of the end surface (circumferential edge, for example) may be covered with a resist, and the remaining section of the end surface (center, for example) may be exposed. The end surface is the surface which faces the direction of the tip. It is unnecessary that the boundary line between the end surface and the outer circumferential surface be definitely indicated. The end surface may be a flat surface or a hemispherical curved surface. The form of the end surface is not limited.

In the example shown in FIG. 4A, the outer edge of the second projecting section 42 (outer edge of the end surface in more detail) is smaller than the outer edge of the first projecting section 41 (outer edge of the end surface in more detail). In other words, the width of the second projecting section 42 (width (diameter, for example) of the end surface in more detail) is smaller than the width of the first projecting section 41 (width (diameter, for example) of the end surface in more detail). As shown in FIG. 4A, the second projecting section 42 may be located inside the outer edge of the first projecting section 41 in a plan view from the second surface 38 of the semiconductor substrate 10. In the case where the insulating layer 28 is formed on the outer circumferential surface of the second projecting section 42, the second projecting section 42 and the insulating layer 28 may be located inside the outer edge of the first projecting section 41.

An insulating layer 50 is formed on the second surface 38 of the semiconductor substrate 10. The insulating layer 50 is formed in the peripheral region of the second projecting section 42. The peripheral region is a region around the second projecting section 42. In more detail, the peripheral region is a region which extends outward from the side surface of the second projecting section 42 (insulating layer 28 on the side surface of the second projecting section 42 in FIG. 4B) beyond the outer edge of the first projecting section 41. The peripheral region may be a region which integrally surrounds a plurality of the second projecting sections 42, or may be a region which separately surrounds each of the second projecting sections 42. The description of the peripheral region also applies to other examples. The insulating layer 50 is formed to avoid the end surface of the second projecting section 42. The insulating layer 50 is formed in the peripheral region of the projecting section 42 (only the peripheral region, for example). The insulating layer 50 is not formed over the entire surface of the second surface 38, and is formed to avoid a part of the second surface 38 (region other than the peripheral region, for example). According to this configuration, since the insulating layer 50 is formed in the peripheral region of the projecting section 42 of the through-hole electrode 40 and is formed to avoid the region other than the peripheral region, occurrence of short circuits can be prevented by sufficiently securing the gap between the stacked semiconductor chips. Moreover, flowing property of an underfill material can be improved by sufficiently securing the gap between the stacked semiconductor chips. Furthermore, since the second projecting section 42 can be reinforced, electrical connection reliability of the stacked semiconductor chips is improved. It is preferable to separately form the insulating layers 50 corresponding to each of the second projecting sections 42 since the space filled with the underfill material can be further secured.

The insulating layer 50 may be formed outward so as to reach the outer edge of the first projecting section 41, or may be formed to extend outward beyond the outer edge of the first projecting section 41. In other words, the width $W_A$ of the insulating layer 50 and the width $W_B$ of the first projecting section 41 have a relationship expressed by $W_A \geq W_B$. This prevents occurrence of short circuits between the stacked semiconductor chips in the peripheral section of the second projecting section 42. If $W_A \geq (1.5 \text{ to } 2.0) \times W_B$, occurrence of short circuits can be prevented more securely.

The insulating layer 50 may be formed of a resin. The insulating layer 50 may be formed of the same material as an insulating material 82 (epoxy resin, for example) used as an underfill as described later. The insulating layer 50 may contain a necessary amount of filler. The insulating layer 50 may be formed by using a spin coater, or may be formed by potting, a printing method, or an ink-jet method. The insulating layer 50 may be efficiently formed only in the peripheral region of the second projecting section 42 (by ink-jet method or mask processing, for example), or may be formed on the entire second surface 38 and then removed (by etching, for example) in the region other than the peripheral region. As shown in FIG. 4B, the insulating layer 50 may be formed to have a uniform thickness. The insulating layer 50 may be formed to have a shape similar to the shape of the outer edge of the first projecting section 41. This enables a region having a certain width from the outer edge of the first projecting section 41 to be insulated. The insulating layer 50 may be formed so that the thickest portion of the insulating layer 50 (section close to the second projecting section 42, for example) is lower than the second projecting section 42. Specifically, the second projecting section 42 may be formed to be higher than the thickest portion of the insulating layer 50. According to this configuration, since the second projecting section 42 has a section which projects from the insulating layer 50, the through-hole electrodes 40 of the stacked semiconductor chips can be bonded securely, whereby electrical connection reliability is improved.

Figure 5:
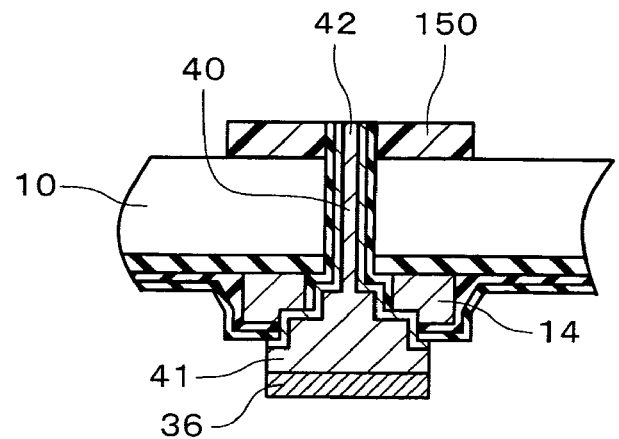
FIG. 5 is illustrative of a modification of an embodiment of the present invention.

As shown in a modification in FIG. 5, an insulating layer 150 may be formed so that its thickest portion (section close to the second projecting section 42, for example) is as high as the second projecting section 42. Specifically, the second projecting section 42 may be formed to be as high as the thickest portion of the insulating layer 150. However, the end surface of the second projecting section 42 is exposed from the insulating layer 150. The other details are the same as described above.

Figure 6:
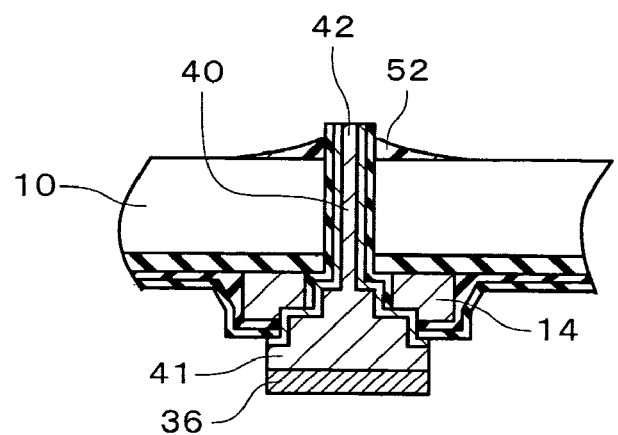
FIG. 6 is illustrative of a modification of an embodiment of the present invention.

As shown in a modification in FIG. 6, an insulating layer 52 may be formed to become thinner as the distance from the second projecting section 42 increases. Specifically, the surface of the insulating layer 52 may be inclined. This allows the underfill material to flow smoothly, whereby flowing property of the underfill material can be further improved. Moreover, since the insulating layer 52 becomes thinner toward the outside, the gap between the stacked semiconductor chips can be more sufficiently secured than the above-described embodiment, whereby flowing property of the underfill material can be improved. The insulating layer having such a configuration may be formed by forming the insulating layer in the peripheral region of the second projecting section 42 to a uniform thickness, and then etching the insulating layer. In this case, an etchant may be used for etching. As the etchant, a solution having a higher etching rate for the material for the insulating layer 52 (resin, for example) than for the through-hole electrode 40 (and peripheral insulating layer 28) is used. The insulating layer 52 may be formed so that its thickest portion (section close to the second projecting section 42, for example) is lower than the second projecting section 42. Specifically, the second projecting section 42 may be formed to be higher than the thickest portion of the insulating layer 52. The other details are the same as described above.

Figure 7:
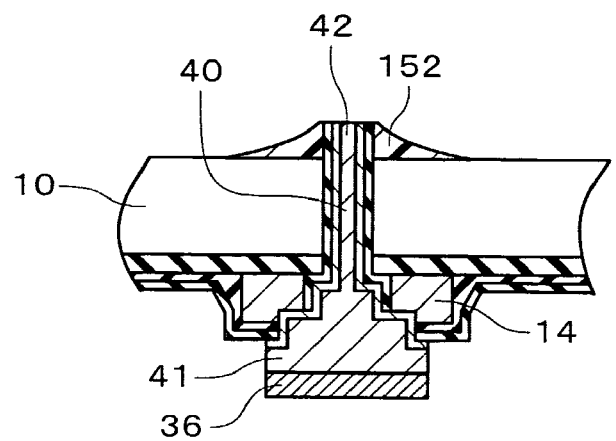
FIG. 7 is illustrative of a modification of an embodiment of the present invention.

As shown in a modification in FIG. 7, an insulating layer 152 may be formed so that the insulating layer 152 becomes thinner as the distance from the second projecting section 42 increases, and its thickest portion (section close to the second projecting section 42, for example) is as high as the second projecting section 42. The details are the same as described above.

The embodiment shown in FIGS. 4A and 4B is described below. The following description may be replaced by the description of the above modification. In the case of forming the insulating layer 50 by etching, the insulating layer 50 may be formed to cover the end surface of the second projecting section 42, and the insulating layer 50 may then be etched. In this case, the insulating layer 50 may be ground or polished before etching. The through-hole electrode 40 may be ground or polished continuously with or separately from grinding or polishing of the insulating layer 50. The insulating layer 50 may be formed in a state in which the through-hole electrode 40 is covered with the insulating layer 28 (see FIG. 3B), and the through-hole electrode 40 may be exposed by grinding or polishing the insulating layer 28.

The fresh surface of the through-hole electrode 40 (second projecting section 42 in more detail) may be exposed. For example, the second projecting section 42 may be ground or polished until the fresh surface (surface formed only of the constituent material, that is, surface from which an oxide film and a deposited organic substance are removed) is exposed. A grindstone may be used for grinding. For example, a grindstone having a grit of about #100 to #4000 may be used. Use of a grindstone having a grit of about #1000 to #4000 prevents breakage of the insulating film 28. Abrasive cloth may be used for polishing. The abrasive cloth may be a suede type or foamed urethane type abrasive cloth, or may be nonwoven fabric. Slurry in which colloidal silica as an abrasive particle is dispersed in an alkaline cationic solution such as Na or $NH_4$ may be used for polishing. The abrasive particles may have a particle diameter of about 0.03 to 10 µm, and be dispersed at a percentage of about 10 wt %. The slurry may include an additive such as a chelating agent, ammonia, or a hydrogen peroxide aqueous solution. The abrasive pressure may be about 5 $g/cm^2$ to 1 $kg/cm^2$.

In the case where the insulating layer 28 is formed, the insulating layer 28 is ground or polished before grinding or polishing the through-hole electrode 40. The insulating layer 28 and the through-hole electrode 40 may be continuously polished or ground. The insulating layer 28 is removed at least in the area formed on the bottom surface of the recess section 22. The through-hole electrode 40 may be exposed, and the fresh surface of the through-hole electrode 40 may be further exposed. The fresh surface of the through-hole electrode 40 may be exposed, and the outer circumferential surface of the end section of the through-hole electrode 40 may be covered with the insulating layer 28. The fresh surface of the outer layer section 32 (barrier layer, for example) may be exposed so that the fresh surface of the center section 34 of the through-hole electrode 40 is not exposed, or the fresh surfaces of the outer layer section 32 and the center section 34 may be exposed. A through-hole electrode excelling in electrical connection characteristics can be formed by exposing the fresh surface of the through-hole electrode 40. The through-hole electrode 40 may be electrically connected with another section before the fresh surface is oxidized (immediately after the fresh surface is exposed, or as soon as possible after the fresh surface is exposed (within 24 hours, for example)).

A semiconductor wafer 70 (see FIG. 8) including the through-hole electrode 40 and the insulating layer 50 is obtained by the above-described steps, for example. In this case, a plurality of the integrated circuits 12 are formed in the semiconductor substrate 10, and the through-hole electrodes 40 are formed corresponding to each of the integrated circuits 12. The detailed structure may be derived from the above-described manufacturing method. Or, a semiconductor chip 80 (see FIG. 10) including the through-hole electrode 40 and the insulating layer 50 is obtained. In this case, one integrated circuit 12 is formed in the semiconductor substrate 10. The detailed structure may be derived from the above-described manufacturing method.

Figure 8:
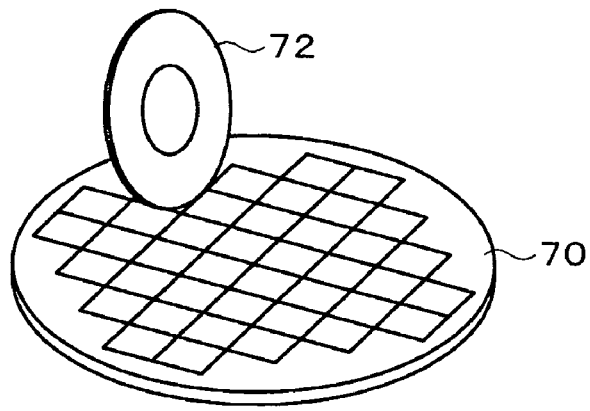
FIG. 8 is illustrative of a method of manufacturing a semiconductor device according to an embodiment of the present invention.

The semiconductor wafer 70 may be cut (diced, for example). As shown in FIG. 8, the semiconductor wafer 70 including the through-hole electrode 40 and the insulating layer 50 is cut (diced, for example). A cutter (dicer, for example) 72 or a laser ($CO_2$ laser or YAG laser, for example) may be used to cut the semiconductor wafer 70. This allows the semiconductor chip 80 (see FIG. 10) including the through-hole electrode 40 and the insulating layer 50 to be obtained. The structure of the semiconductor chip 80 may be derived from the above-described manufacturing method.

Figure 9:
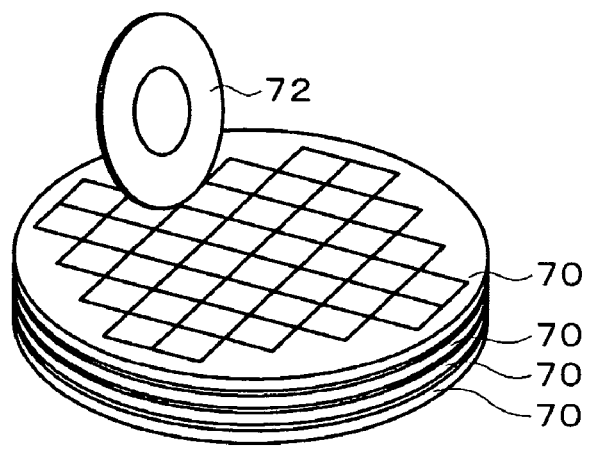
FIG. 9 is illustrative of a method of manufacturing a semiconductor device according to an embodiment of the present invention.
Figure 10:
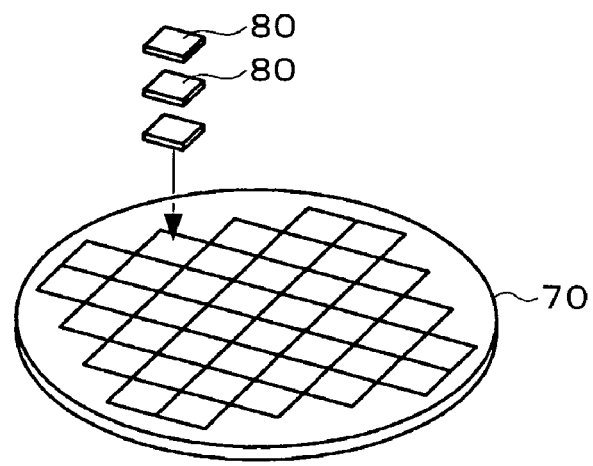
FIG. 10 is illustrative of a method of manufacturing a semiconductor device according to an embodiment of the present invention.

The method of manufacturing the semiconductor device may include a step of stacking the semiconductor substrates 10. As shown in FIG. 9, a plurality of the semiconductor wafers 70 including the through-hole electrode 40 and the insulating layer 50 may be stacked. As shown in FIG. 10, a plurality of the semiconductor chips 80 including the through-hole electrode 40 and the insulating layer 50 may be stacked. The semiconductor chip 80 including the through-hole electrode 40 and the insulating layer 50 and a plurality of the semiconductor wafers 70 including the through-hole electrode 40 and the insulating layer 50 may be stacked.

The upper and lower adjacent semiconductor substrates 10 among the stacked semiconductor substrates 10 are electrically connected through the through-hole electrodes 40. In more detail, the upper and lower adjacent through-hole electrodes 40 (first projecting section 41 of one semiconductor substrate and the second projecting section 42 of the other semiconductor substrate in more detail) may be electrically connected. A solder junction or a metal junction, an anisotropic conductive material (anisotropic conductive film or anisotropic conductive paste), pressure welding utilizing the shrinkage force of an insulating adhesive, or a combination of these may be used to provide electrical connection.

Figure 11:
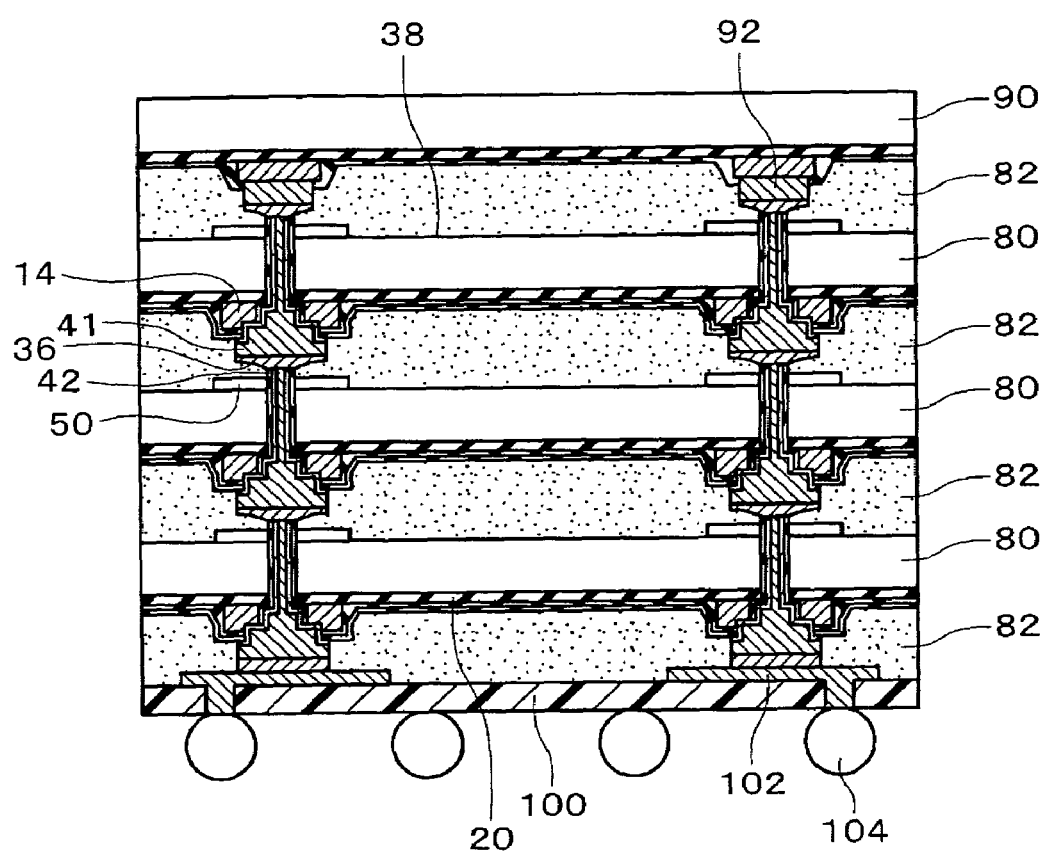
FIG. 11 is illustrative of a semiconductor device according to an embodiment of the present invention.

FIG. 11 shows a semiconductor device (stacked semiconductor device) according to an embodiment of the present invention. The stacked semiconductor device includes a plurality of the semiconductor chips 80 including the through-hole electrode 40. The semiconductor chips 80 are stacked. The upper and lower adjacent through-hole electrodes 40 or the through-hole electrode 40 and the electrode 14 may be bonded through a soldering material 36. The soldering material 36 is provided on the first projecting section 41 of one semiconductor substrate 10, and placed on the second projecting section 42 of the other semiconductor substrate 10. The insulating layer 50 (or one of the insulating layers 52, 150, and 152) is formed in the peripheral region of the second projecting section 42 of the through-hole electrode 40. Therefore, even if the soldering material 36 flows (or separates and rolls) toward the peripheral region of the second projecting section 42, the soldering material 36 does not come in contact with the second surface 38 (semiconductor section, for example) of the semiconductor chip 80. Therefore, occurrence of short circuits or electrical failure due to the soldering material 36 can be prevented. The gap between the stacked semiconductor chips 80 is preferably filled with the insulating material 82 (resin (epoxy resin), for example). The insulating material 82 is an underfill material, and maintains and reinforces the bonding state between the upper and lower adjacent semiconductor substrates 10. If the insulating layer 50 is formed of the same material as the insulating material 82, occurrence of interfacial separation caused by different types of materials can be prevented. The description derived from the method of manufacturing the semiconductor device according to the present embodiment or its modification (see FIGS. 1A to 10) may be applied to the semiconductor device according to the present embodiment.

A semiconductor chip 90 which does not include a through-hole electrode may be stacked on one of the stacked semiconductor chips 80 (outermost semiconductor chip 80 in the direction of the second surface 38, for example). The description of the semiconductor chip 80 applies to the semiconductor chip 90 except that the semiconductor chip 90 does not include a through-hole electrode. The through-hole electrode 40 of the semiconductor chip 80 may be bonded to an electrode 92 of the semiconductor chip 90. In this case, it is preferable that the insulating layer 50 be formed to extend outward beyond the outer edge of the electrode 92 (outer edge of the end surface of the electrode 92, for example).

The stacked semiconductor chips 80 may be mounted on an interconnect substrate 100. The outermost semiconductor chip 80 among the stacked semiconductor chips 80 may be mounted on the interconnect substrate 100 (interposer, for example). The semiconductor chip 80 may be mounted by face-down bonding. In this case, the semiconductor chip 80 having the outermost (lowermost, for example) through-hole electrode 40 in the direction of the first surface 20 is mounted on the interconnect substrate 100. For example, the first projecting section 41 of the through-hole electrode 40 or the electrode 14 may be electrically connected with (bonded to, for example) an interconnect pattern 102. The insulating material 82 may be provided between the semiconductor chip 80 and the interconnect substrate 100.

The stacked semiconductor chips 80 may be bonded face up to the interconnect substrate 100 (not shown). In this case, the second projecting section 42 of the through-hole electrode 40 from the second surface 38 may be electrically connected with (bonded to, for example) an interconnect pattern 102. An external terminal 104 (solder ball, for example) electrically connected with the interconnect pattern 102 is formed on the interconnect substrate 100. A stress relief layer may be formed on the semiconductor chip 80. An interconnect pattern may be formed on the stress relief layer from the electrode 14, and the external terminal may be formed on the interconnect pattern. The other details may be derived from the above-described manufacturing method.

Figure 12:
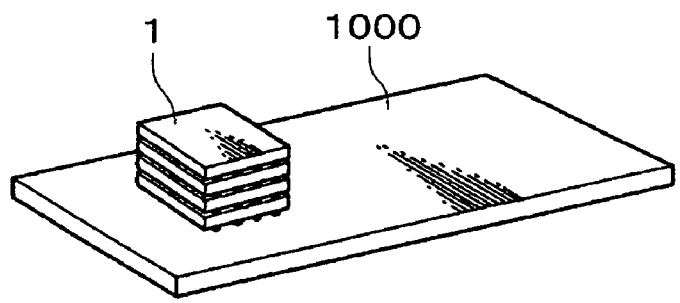
FIG. 12 shows a circuit board according to an embodiment of the present invention.
Figure 13:
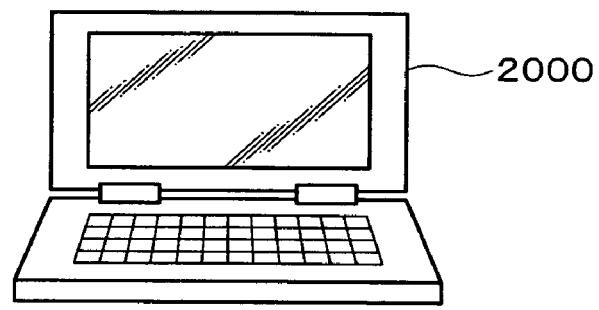
FIG. 13 shows an electronic instrument according to an embodiment of the present invention.
Figure 14:
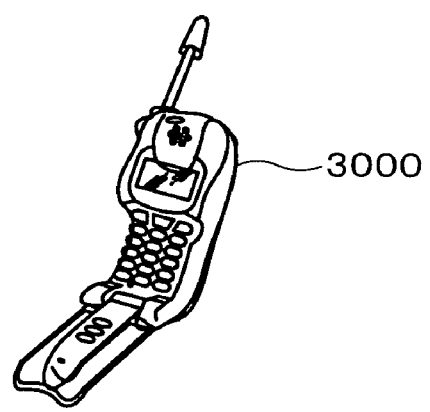
FIG. 14 shows an electronic instrument according to an embodiment of the present invention.

FIG. 12 shows a circuit board 1000 on which a semiconductor device 1, in which a plurality of semiconductor chips are stacked, is mounted. The semiconductor chips are electrically connected through the through-hole electrodes 40. FIGS. 13 and 14 respectively show a notebook-type personal computer 2000 and a portable telephone 3000 as examples of electronic instruments including the above semiconductor device.

The present invention is not limited to the above-described embodiments. Various modifications and variations can be made. For example, the present invention includes configurations substantially the same as the configurations described in the embodiments (in function, in method and effect, or in objective and effect). The present invention also includes a configuration in which an unsubstantial portion in the above-described embodiments is replaced. The present invention also includes a configuration having the same effects as the configurations described in the embodiments, or a configuration capable of achieving the same objective. Further, the present invention includes a configuration in which a known technique is added to the configurations described in the embodiments.

What is claimed is:

1. A semiconductor device comprising:
   a semiconductor substrate which includes a first surface in which an integrated circuit is formed, and a second surface opposite to the first surface;
   a through-hole electrode which is formed through the semiconductor substrate, and includes a first projecting section which projects from the first surface and a second projecting section which projects from the second surface; and
   an insulating layer which is formed in a region around the second projecting section except a part of the second surface so as to extend outward beyond an outer edge of the first projecting section, the insulating layer is formed to become thinner as a distance from the second projecting section increases.

2. The semiconductor device as defined in claim 1, wherein an outer edge of the second projecting section is smaller than the outer edge of the first projecting section.

3. The semiconductor device as defined in claim 1, wherein a soldering material is provided on the first projecting section.

4. The semiconductor device as defined in claim 1, wherein the insulating layer is formed so that an outline of the insulating layer has a similar shape to an outline of the first projecting section.

5. The semiconductor device as defined in claim 1, wherein the insulating layer is formed so that an upper surface of the thickest portion of the insulating layer is on the same level as an upper surface of the second projecting section.

6. The semiconductor device as defined in claim 1, wherein the insulating layer is formed so that the thickest portion of the insulating layer is lower than the second projecting section.

7. A semiconductor device comprising:
   a plurality of the semiconductor devices as defined in claim 1 which are stacked, wherein two adjacent semiconductor devices among the plurality of semiconductor devices are electrically connected through the through-hole electrodes.

8. A circuit board on which the semiconductor device as defined in claim 1 is mounted.

9. An electronic instrument comprising the semiconductor device as defined in claim 1.

10. The semiconductor device as defined in claim 1, wherein the part of the second surface is exposed from the insulating layer.

11. A method of manufacturing a semiconductor device, comprising:
    (a) forming a through-hole electrode through a semiconductor substrate which includes a first surface in which an integrated circuit is formed and a second surface opposite to the first surface, the through-hole electrode including a first projecting section which projects from the first surface and a second projecting section which projects from the second surface; and
    (b) forming an insulating layer in a region around the second projecting section except a part of the second surface so as to extend outward beyond an outer edge of the first projecting section,
    wherein, in the step (b), the insulating layer is formed to become thinner as a distance from the second projecting section increases.

12. The method of manufacturing a semiconductor device as defined in claim 11, wherein an outer edge of the second projecting section is smaller than the outer edge of the first projecting section.

13. The method of manufacturing a semiconductor device as defined in claim 11,
    wherein a plurality of the integrated circuits are formed in the semiconductor substrate, and the through-hole electrode is formed in each of the integrated circuits, and
    wherein the method further includes cutting the semiconductor substrate.

14. The method of manufacturing a semiconductor device as defined in claim 11, further comprising:
    stacking a plurality of the semiconductor substrates for which the steps (a) and (b) have been completed, and electrically connecting two of the semiconductor substrates adjacent to each other through the through-hole electrodes.

15. The method of manufacturing a semiconductor device as defined in claim 14, further comprising:
    injecting an insulating material between the two semiconductor substrates adjacent to each other.

16. The method of manufacturing a semiconductor device as defined in claim 15, wherein the insulating material is formed of the same material as a material of the insulating layer.

17. The method of manufacturing a semiconductor device as defined in claim 11, wherein the step (a) further includes providing a soldering material on the first projecting section.

18. The method of manufacturing a semiconductor device as defined in claim 11, wherein, in the step (b), the insulating layer is formed so that an outline of the insulating layer has a similar shape to an outline of the first projecting section.

19. The method of manufacturing a semiconductor device as defined in claim 11, wherein, in the step (b), the insulating layer is formed so that an upper surface of the thickest portion of the insulating layer is on the same level as an upper surface of the second projecting section.

20. The method of manufacturing a semiconductor device as defined in claim 11, wherein, in the step (b), the insulating layer is formed so that the thickest portion of the insulating layer is lower than the second projecting section.

* * * * *